United States Patent [19]
Mancini

[11] Patent Number: 5,831,423
[45] Date of Patent: Nov. 3, 1998

[54] PHASE METER AND METHOD OF PROVIDING A VOLTAGE INDICATIVE OF A PHASE DIFFERENCE

[75] Inventor: Ronald Alfred Mancini, Melbourne Beach, Fla.

[73] Assignee: Harris Corporation, Melbourne, Fla.

[21] Appl. No.: 608,728

[22] Filed: Feb. 29, 1996

[51] Int. Cl.$^6$ .................................................. G01R 25/00
[52] U.S. Cl. ..................................... 324/76.77; 324/76.83; 326/127; 327/7
[58] Field of Search ........................... 324/76.77, 76.82, 324/76.83, 76.52; 327/3, 7, 8, 52, 56, 563, 560; 326/126, 127

[56] References Cited

U.S. PATENT DOCUMENTS

| | | | |
|---|---|---|---|
| 3,441,745 | 4/1969 | Reeves et al. | 34/76.52 |
| 3,469,196 | 9/1969 | Cowin et al. | 324/76.82 X |
| 3,519,845 | 7/1970 | Larriva et al. | 326/54 |
| 4,017,801 | 4/1977 | Riedel | 324/76.83 |
| 4,534,004 | 8/1985 | Vollmayr | 362/268 |

OTHER PUBLICATIONS

Linear Databook, National Semicinductor, "LM 1496 Ballanced Modulator–Demodulator", National Semiconductor Corporation, pp. 10–84.

*Primary Examiner*—Ernest F. Karlsen
*Assistant Examiner*—Diep Do
*Attorney, Agent, or Firm*—Rogers & Killeen

[57] ABSTRACT

A phase meter and method of providing a voltage indicative of a phase difference between a reference signal and an input signal in which the amplitudes of the two signals are made approximately the same to cancel potential phase errors caused by different amplitudes, and the two signals are provided to two matched comparators, one receiving the input signal and the other receiving the reference signal. The two matched comparators are connected together so as to provide an output logic signal in accordance with a prescribed, unconventional, truth table. The output logic signal is a pulse whose duration is proportional to the phase difference. The output logic signal is converted to a voltage indicative of the phase difference between the reference signal and the input signal. The phase meter is relatively simple to make and a preferred embodiment measures phase shift directly with a 10 mV/degree output at up to 10 MHz.

25 Claims, 4 Drawing Sheets

PHASE METER AND METHOD OF PROVIDING A VOLTAGE INDICATIVE OF A PHASE DIFFERENCE

BACKGROUND OF THE INVENTION

The present invention relates to phase measurement devices and methods, and more particularly to phase meter and method of providing a voltage indicative of a phase difference between a reference signal and an input signal.

Phase measurements are used in a variety of applications during test and manufacture. A phase difference between two signals is measured by determining the difference in the times of occurrences of corresponding signal events, such as arrival of a wave crest or change of state. There are a number of devices for performing this function, although it is desirable that the device be capable of being used quickly and easily and that it is relatively inexpensive to manufacture. Further, it is desirable that such a device be capable of operating over a wide range of frequencies, up to 10 MHz for example.

Prior art devices have not met all of these goals satisfactorily and, accordingly, it is an object of the present invention to provide a novel phase meter and method which does meet all of these goals.

With reference to FIG. 1, phase measurement may be used to test a device 12 (the device under test, "DUT") by providing a reference signal to the DUT and to a phase meter 14, and then comparing the reference signal to a signal from DUT 12 which is also provided to phase meter 14, denoted the input signal. Phase meter 14 provides an output indicative of the phase difference between the reference signal and the input signal.

However, the use herein of the terms "reference signal" and "input signal" is not meant to refer to this specific arrangement, and unless otherwise indicated reference to these signals should be considered reference to any two signals for which a phase difference is be determined by the phase meter and method of the present invention, without regard to which signal may have come through a DUT.

It is another object of the present invention to provide a novel phase meter and method in which two matched comparators, one for receiving the reference signal and one for receiving the input signal, provide a single pulse output whose duration is proportional to the phase difference between the two signals, the output being the result of connecting the two matched comparators so that the output is provided in accordance with a specified truth table which is not found in a conventional single logic gate.

It is yet another object of the present invention to provide a novel phase meter and method in which the reference signal and the input signal are provided novel logic gate with two pairs of transistors connected so that one of the transistors from each of the pairs has its base connected to ground, and so that the other of the transistors from a first of the pairs has its base connected to receive the input signal and the other of the transistors from a second of the pairs has its base connected to receive the reference signal, and in which collectors of (a) the transistor in the second pair with its base connected to receive the reference signal, and (b) the transistor in the first pair with its base connected to the ground potential, are connected for providing an output logic signal.

It is still another object of the present invention to provide a novel phase meter and method in which one of plural operational amplifiers with about the same propagation delay and impedance level is selected to provide the reference signal so that a difference in amplitudes of the reference signal and the input signal can be reduced.

It is a further object of the present invention to provide a novel phase meter and method in which a buffer for receiving the input signal has about the same propagation delay as operational amplifiers which selectively provide the reference signal so that the propagation delays of the two signals match.

It is yet a further object of the present invention to provide a novel phase meter and method in which an output logic signal voltage variation is damped with a clamping circuit connected to an output of the two comparators.

It is still a further object of the present invention to provide a novel phase meter which is relatively simple to make and which measures phase shift directly with a 10 mV/degree output at up to 10 MHz.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
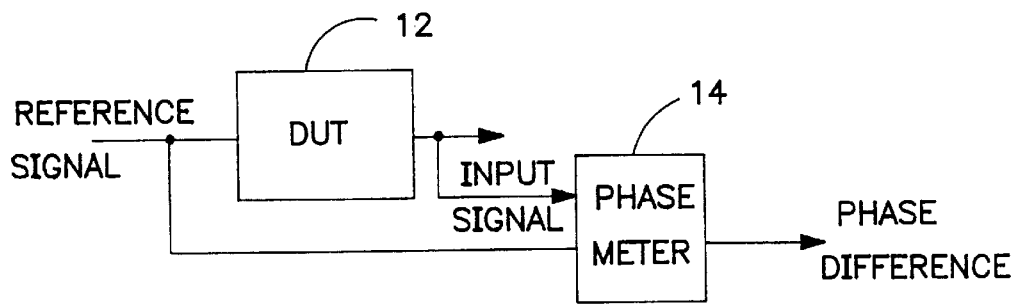
FIG. 1 is a system diagram illustrating conventional connection of a device under test and a phase meter.
Figure 2:
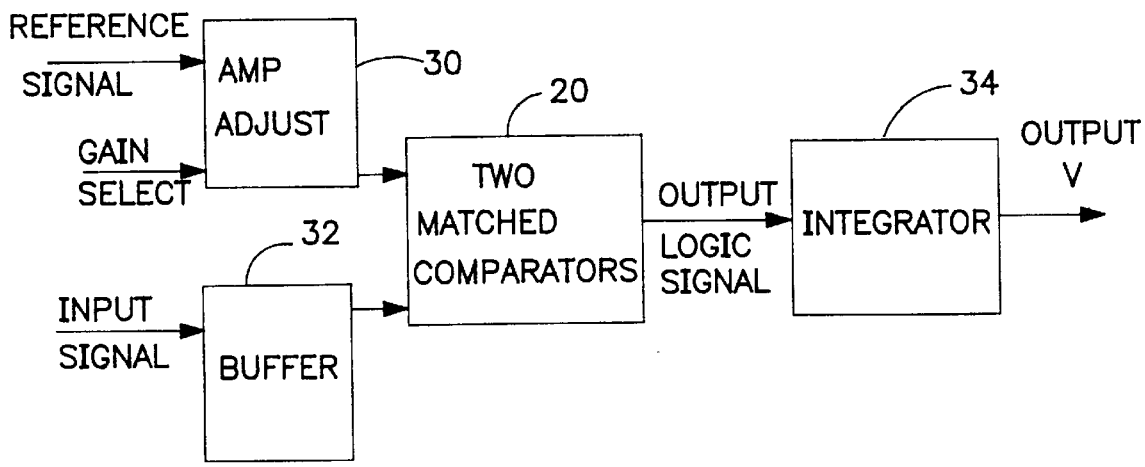
FIG. 2 is a block diagram of an embodiment of a phase meter of the present invention.

With reference now to FIG. 2, an embodiment of the present invention may include two matched comparators 20, one for receiving the input signal and the other for receiving the reference signal. The two comparators are matched in that their operating characteristics are substantially the same. The two comparators 20 may be connected together so as to provide an output logic signal in accordance with the following truth table,

| Reference Signal | Input Signal | Output Logic Signal |
| --- | --- | --- |
| 0 | 0 | 0 |
| 0 | 1 | 1 |
| 1 | 0 | 0 |
| 1 | 1 | 0 |

This truth table is not conventionally found in any common logic function, such as a NAND, NOR or other gate. While it is apparent that the table could be generated by a combination of conventional gates, such a combination would require two or more levels of logic which would cause different propagation delays in the signal paths for the reference signal and the input signal. The two matched comparators 20 provide this table without resorting to two or more levels of logic.

Figure 3:
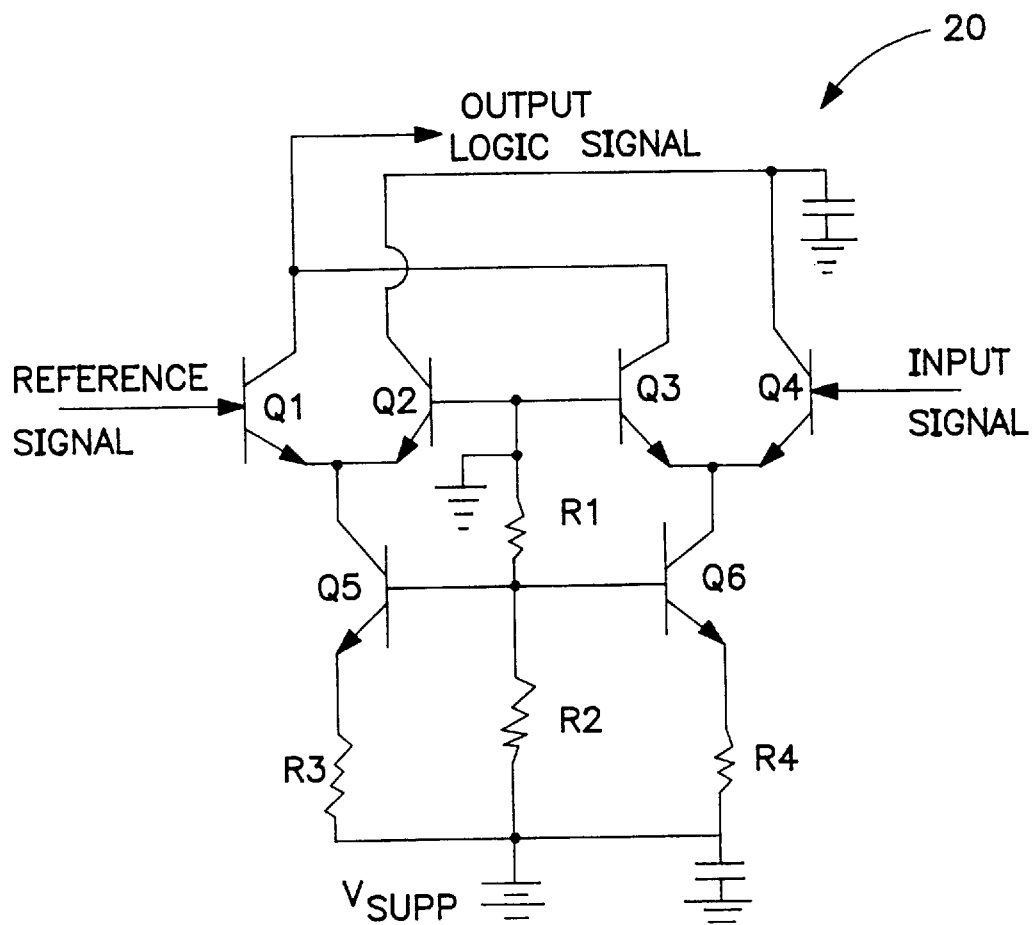
FIG. 3 is a circuit diagram of an embodiment of the two comparators of the present invention.

With reference now to FIG. 3, a preferred embodiment of the two matched comparators 20 for providing the output logic signal in accordance with the truth table above may include two pairs of transistors Q1, Q2 and Q3, Q4 connected so that one of the transistors Q2 and Q3 from each of the pairs has its base connected to a ground potential, and so that the other of the transistors Q4 from a first of the pairs has its base connected to receive the input signal and the other of the transistors Q1 from a second of the pairs has its base connected to receive the reference signal. The collectors of transistor Q1 and transistor Q3 may be connected to provide the output logic signal.

The two matched comparators 20 may also include a third pair of transistors Q5 and Q6, one having its collector connected to emitters of transistors Q1 and Q2 and the other having its collector connected to emitters of transistors Q3 and Q4, and wherein transistors Q5 and Q6 have their bases connected. Collector currents of transistors Q5 and Q6 are approximately the same.

By way of explanation, the two matched comparators 20 are configured to convert analog waveforms to digital waveforms. The two pairs of transistors in the preferred embodiment are long-tailed pairs with grounded bases so that they function as comparators for signals exceeding a few mV (as is known, comparators convert any waveform to digital.) Resistors R1 and R2 bias the current sources to a predetermined voltage (e.g., −2.2 volts, with Vsupp at −5 volts) and resistors R3 and R4 set the comparator currents to a predetermined amperage (e.g., 10 mA) so that the transistors operate at their highest possible gain bandwidth.

Figure 4:
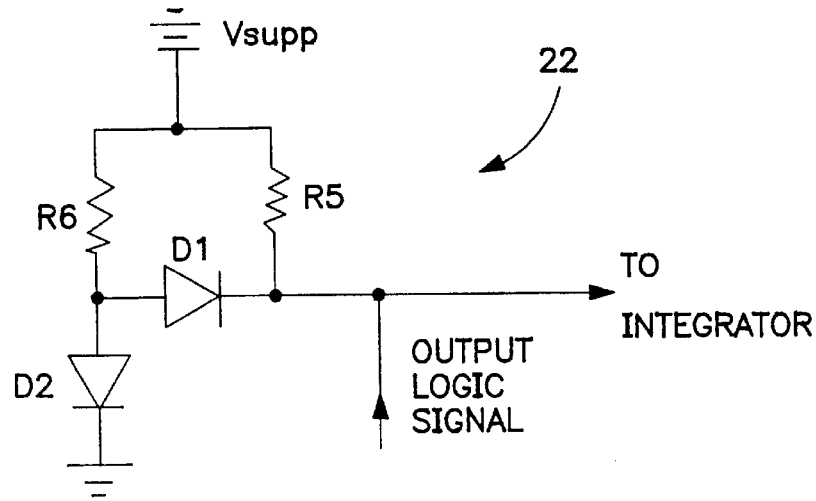
FIG. 4 is a circuit diagram of an embodiment of a clamp circuit which may be used with the embodiment of FIG. 3.
Figure 5:
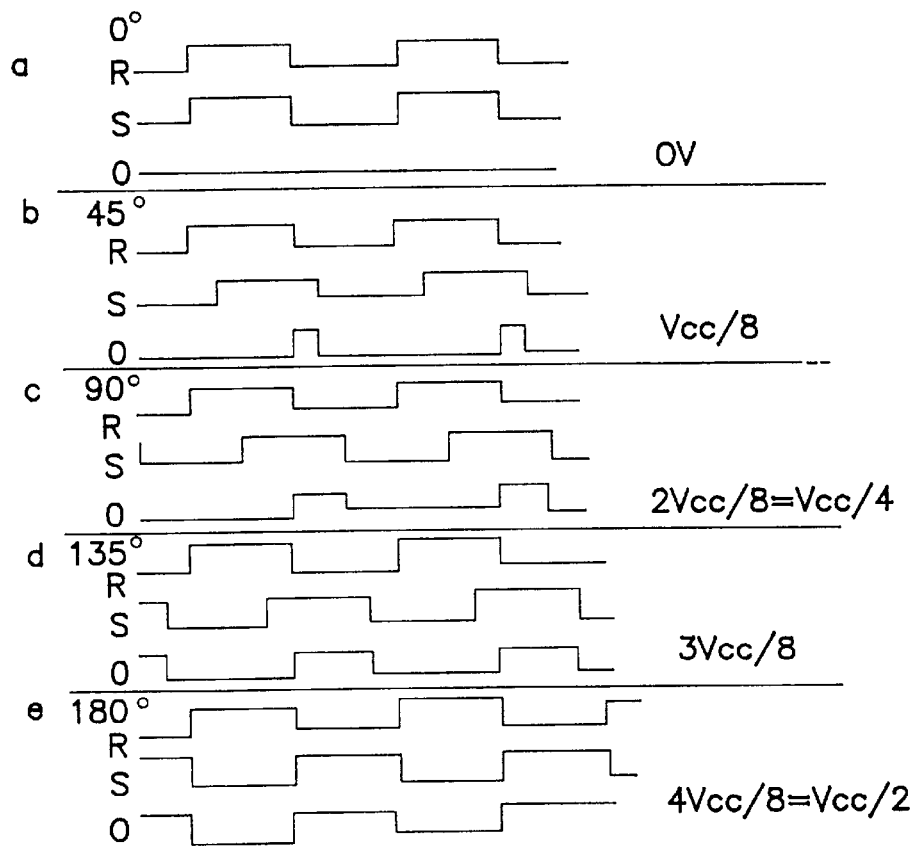
FIG. 5a–e are five graphs illustrating the relationship of reference signal, input signal and output logic signal in the embodiment of FIGS. 3 and 4.

In a further embodiment, two matched comparators 20 may also include a clamping circuit for damping variations in the voltage (the output logic signal) at the collectors of transistors Q1 and Q3. An exemplary clamping circuit 22 is illustrated in FIG. 4 (other clamping circuits also being applicable herein,) in which diodes D1 and D2 form an output clamp which keeps collector voltage constant. Resistor R5 may be selected to that the collector voltage drop would be greater than Vsupp (e.g., +5 volts) to insure that diode D1 turns on. Thus, the output logic signal voltage swing will be constant at $$V_{out} = V_{supp} - V_{D1} - V_{D2}$$

The reference and input signals will have approximately the same amplitude (discussed below), and the comparators are matched, and thus the output logic signal voltage swing will be constant, leaving phase as the only variable.

In operation, transistors Q5 and Q6 become constant current sources, and by virtue of their symmetry their collector currents are almost equal. The constant current insures that the turn off/on times/transients are equal. Transistors Q1–Q4 are differential pairs with bases referenced to ground, and thus act as switches if their base voltages are more than a few mV from ground. The reference signal and the input signal are applied to opposing bases of the differential pairs of transistors. When either base is positive, its corresponding transistor is "on", and when both bases are negative both transistors are "off".

The collector current from transistors Q1 and Q3 flows through R5 in clamping circuit 22 causing a voltage drop thereacross. The collector current may set so that the current from either transistor Q1 or Q3 would drop more than the supply voltage (e.g., 5 volts) if that were possible. Diodes D1 and D2 and resistor R6 prevent saturation of transistors Q1 and Q3. Resistor R6 may bias diode D2 with slightly more than two time the collector current flowing in diode D2. When collector current first flows it will come out of resistor R5, and when the collector voltage equals the "on" voltage of diode D2 minus the cut-in voltage of diode D1, the current will flow out of diode D1. Thus, the collector voltage excursion is limited to $Vcc-V_{D1}-V_{D2}$, which is a constant value. Note that the collector voltage drop is independent of the number of transistors turned "on", and that the average voltage is a direct positive function of the phase difference. FIG. 5a–e illustrate examples of output logic signal voltages (traces "O") for reference signals (traces "R") and input signals (traces "S") of varying phase differences. The length of the voltage pulse in the "O" traces is linearly proportional to the phase difference and thus an integral of this voltage will yield a voltage to phase difference relationship which is linear.

In an alternative embodiment, the switching voltage may be reduced even further to a few $\mu V$ by making the two comparators precision comparators using methods known in the art. Further, any temperature sensitivity of the circuit may be resolved using conventional techniques.

With reference once again to FIG. 2, a further embodiment of the present invention may include components for reducing the amplitude difference between the reference and input signals. The conversion of the signals to digital signals in the two comparators 20 can be affected by the amplitudes of the two signals; if they are not about the same, they will have different slew rates which cause phase errors. To this end, the further embodiment may include a selectable gain amplifier 30 for adjusting the gain of the reference signal by an amount about the same as that of the DUT (e.g., within an order of magnitude.) Amplifier 30 is shown in the reference signal line because the reference signal typically has the smaller gain, although this is not required. Selectable gain amplifier 30 may be provided with a selection of set gains (e.g., 1, 2, 5, 10). A selectable gain amplifier affords advantages over other options, such as selectable or tuned resistive feedback amplifiers, because the selectable gain amplifier can be tuned so that each selection has nearly the same, constant, propagation delay. As will be discussed in a more detailed embodiment below, selectable gain amplifier 30 may include plural operational amplifiers and switches for selecting which one of the operational amplifiers is to be connected to the reference signal.

The propagation delay in the reference signal line may be effectively cancelled by including a buffer 32 with a similar propagation delay in the input signal line. Buffer 32 is preferably nearly identical in construction (e.g., have the same or similar circuit layout) to the operational amplifiers in selectable gain amplifier 30 so that the propagation delay through the two lines match and therefor cancel. Buffer 32 may also have about the same impedance level as that of the amplifier 30 to that an error due to mismatched loading is not introduced.

The further embodiment may also include an integrator 34 for converting the output logic signal from comparators 20 to a voltage representative of the phase difference. Integrators 34 are known in the art and may be conventional.

Figure 6:
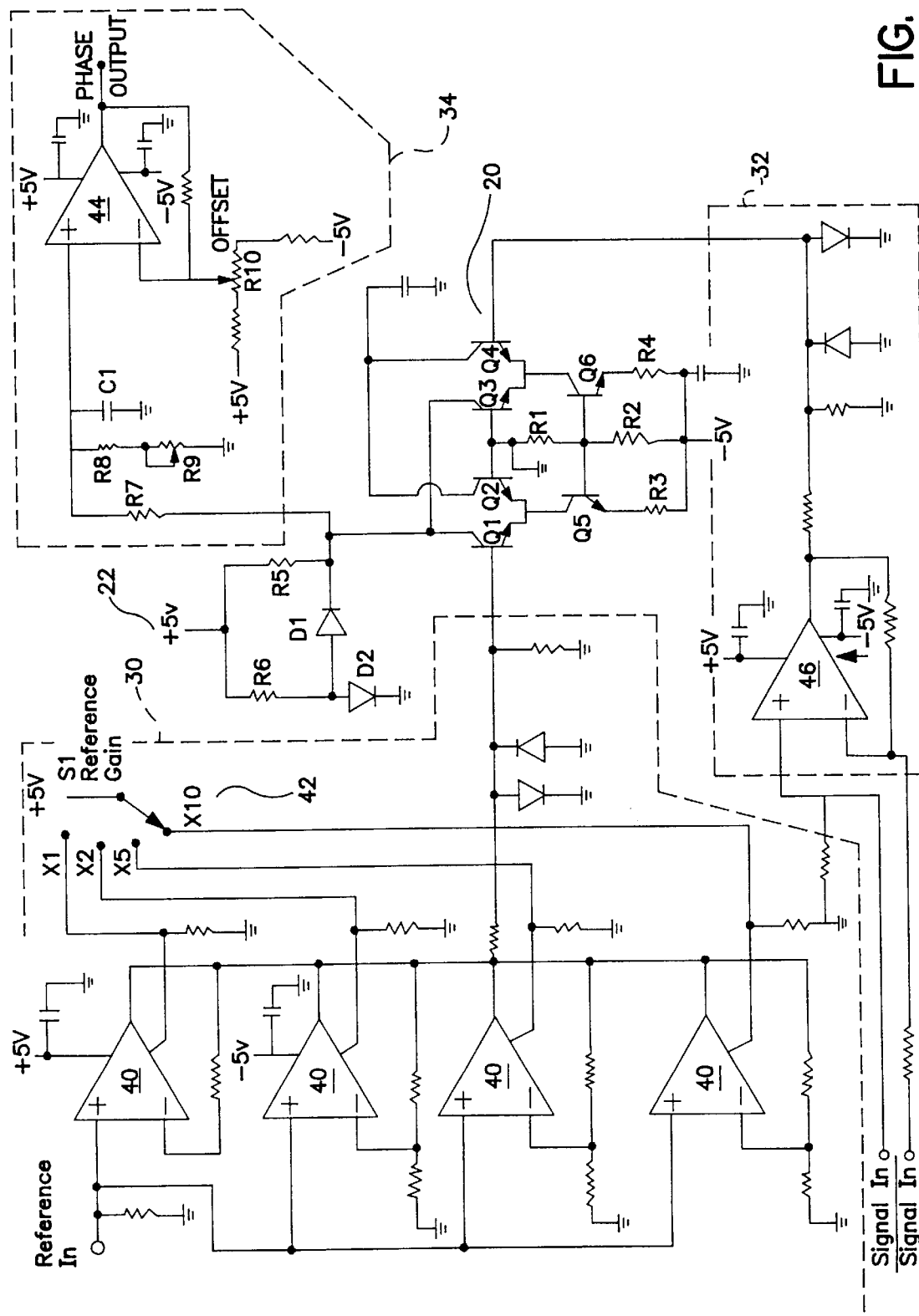
FIG. 6 is a circuit diagram illustrating a further embodiment of the present invention.

With reference now to FIG. 6, an embodiment of the present invention may be seen in greater detail. Reference numbers from prior figures have been retained to facilitate an understanding of the figure. In this embodiment the phase output from integrator 34 has been scaled and offset to produce an output voltage of 1.8 volts for a phase difference of 180°, with a linear relationship between the output voltage and phase difference from 0° to 180°. It functions up to 10 MHz, and will be apparent to those of skill in the art is relatively easy to manufacture from standard components and is simple to calibrate. Accuracy may be improved by the use of components rated to at least 125 MHz.

Selectable gain amplifier 30 may include four operational amplifiers 40 for selectively increasing the gain of the reference signal by a factor of 1, 2, 5 or 10. Switch 42 may be provided for selecting the one of operational amplifiers 40 which provides the gain which most closely matches the gain of the DUT.

Integrator 34 may include circuitry for adjusting the average collector voltage, such as resistors R7, R8 and R9 which function as a divider, with R9 providing a gain, or span, adjustment. Capacitor C1 functions as an integrator yielding the average value of the voltage across the divider circuit. Operational amplifier 44 may be selected to have a low input current so that it will not discharge capacitor C1 and so that it buffers C1, while presenting a low impedance output. Resistor R10 functions as an offset adjustment to set the zero phase difference voltage during calibration.

The components in FIG. 6 may be conventional, such as Harris Corporation HA5024 for operational amplifiers 40, HA5170 for operational amplifier 44, HA5020 for operational amplifier 46 in buffer 32, and HFA3102 for transistors Q1–6.

The present invention affords various advantages, not the least of which is the simplicity of operation and design of the phase meter. More specifically, the phase meter minimizes errors because it has a small threshold voltage, which can be even further reduced using precision comparator methods. Conventional logic gates have a threshold voltage which is too high. For example, a standard digital XNOR gate could generate a pulse width proportional to the phase difference between signals, but it would have a large error for anything except digital signals with extremely fast edges and even then would require additional circuitry; it cannot process analog signals. Further advantages include transistors which do not saturate so that on/off time errors are minimized, a collector voltage drop which is constant, and a unique configuration of only six transistors (in the two comparators) not found in conventional logic gates. The selectable amplifiers minimize slew rate errors caused by different amplitude signals, the buffer matches propagation delay so that the delays cancel, and the phase difference to voltage relationship is linear and positive increasing.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A phase meter for providing a voltage indicative of a phase difference between a reference signal and an input signal, the phase meter comprising:

two matched comparators, one of said comparators for receiving the input signal and the other of said comparators for receiving the reference signal, said two comparators being connected together so as to provide an output logic signal in accordance with the following truth table,

| Reference Signal | Input Signal | Output Logic Signal |
| --- | --- | --- |
| 0 | 0 | 0 |
| 0 | 1 | 1 |

-continued

| Reference Signal | Input Signal | Output Logic Signal |
| --- | --- | --- |
| 1 | 0 | 0 |
| 1 | 1 | 0. |

2. The phase meter of claim 1 wherein said two matched comparators comprise two pairs of transistors connected so that one of said transistors from each of said pairs has its base connected to a ground potential, and so that the other of said transistors from a first of said pairs has its base connected to receive the input signal and the other of said transistors from a second of said pairs has its base connected to receive the reference signal.

3. The phase meter of claim 2 wherein collectors of (a) said transistor in said second pair with its base connected to receive the reference signal, and (b) said transistor in said first pair with its base connected to the ground potential, are connected for providing the output logic signal.

4. The phase meter of claim 3 wherein said two matched comparators further comprise a third pair of transistors, one having its collector connected to emitters of said transistors in said first pair and the other having its collector connected to emitters of said transistors in said second pair, and wherein said transistors in said third pair have their bases connected, whereby currents in collectors of said transistors in said third pair are approximately the same.

5. The phase meter of claim 1 wherein said two matched comparators comprise two pairs of transistors, and wherein the output logic signal is provided from collectors of two of said transistors, one from each of said two pairs.

6. The phase meter of claim 5 wherein currents from said two collectors are about equal.

7. The phase meter of claim 1 further comprising means for converting the output logic signal to a voltage indicative of the phase difference.

8. The phase meter of claim 7 further comprising clamping means for damping output logic signal voltage variation, said clamping means being connected between said two comparators and said means for converting.

9. The phase meter of claim 1 further comprising plural operational amplifiers with about the same propagation delay for providing the reference signal to said two matched comparators, and means for providing the reference signal through a selected one of said operational amplifiers to selectively vary the amplitude of the reference signal, whereby a difference in amplitudes of the reference signal and the input signal can be reduced.

10. The phase meter of claim 9 further comprising a buffer for receiving the input signal and for delaying the propagation of the input signal therethrough by a time which is about the same as the propagation delay encountered by the reference signal through the selected one of said operational amplifiers.

11. The phase meter of claim 10 wherein said buffer comprises a further operational amplifier, and wherein said plural operational amplifiers and said further operational amplifier have similar circuit diagrams so that their propagation delays are about the same.

12. The phase meter of claim 10 wherein said buffer comprises a further operational amplifier, and wherein said plural operational amplifiers and said further operational amplifiers present about the same impedance levels.

13. A phase meter for providing a voltage indicative of a phase difference between a reference signal and an input signal, the phase meter comprising:

means for varying an amplitude of one of the reference signal and the input signal so their amplitudes are approximately the same;

comparison means for providing an output logic signal and comprising two pairs of transistors connected so that one of said transistors from each of said pairs has its base connected to a ground potential, and so that the other of said transistors from a first of said pairs has its base connected to receive the input signal and the other of said transistors from a second of said pairs has its base connected to receive the reference signal, wherein collectors of (a) said transistor in said second pair with its base connected to receive the reference signal, and (b) said transistor in said first pair with its base connected to the ground potential, are connected for providing the output logic signal; and means for converting the output logic signal to a voltage indicative of the phase difference.

14. The phase meter of claim 13 wherein the output logic signal is provided in accordance with the following truth table;

| Reference Signal | Input Signal | Output Logic Signal |
|---|---|---|
| 0 | 0 | 0 |
| 0 | 1 | 1 |
| 1 | 0 | 0 |
| 1 | 1 | 0. |

15. The phase meter of claim 13 wherein said comparison means further comprises a third pair of transistors, one having its collector connected to emitters of said transistors in said first pair and the other having its collector connected to emitters of said transistors in said second pair, and wherein said transistors in said third pair have their bases connected, whereby currents in collectors of said transistors in said third pair are approximately the same.

16. The phase meter of claim 13 wherein said means for varying comprises plural operational amplifiers and means for selectively providing the reference signal therethrough to selectively vary the amplitude of the reference signal.

17. The phase meter of claim 16 further comprising a buffer for receiving the input signal and for providing a delay for the input signal which is about the same as a delay encountered by the reference signal in said operational amplifiers.

18. The phase meter of claim 13 further comprising clamping means for preventing saturation of one of said transistors in said first and second pairs which are for providing the output logic signal, said clamping means being connected between said comparison means and said means for converting, whereby on and off time errors of said transistors are reduced.

19. The phase meter of claim 13 wherein said means for converting comprises an operational amplifier for integrating the output logic signal.

20. The phase meter of claim 13 wherein said comparison means is for providing the output logic signal when the reference signal and the input signal are each less than 10 mV.

21. A method of providing a voltage indicative of a phase difference between a reference signal and an input signal, the method comprising the steps of:

(a) varying an amplitude of one of the reference signal and the input signal so their amplitudes are approximately the same;

(b) providing the reference signal and the input signal to two matched comparators, one receiving the input signal and the other receiving the reference signal;

(c) providing an output logic signal from the two matched comparators in accordance with the following truth table,

| Reference Signal | Input Signal | Output Logic Signal |
|---|---|---|
| 0 | 0 | 0 |
| 0 | 1 | 1 |
| 1 | 0 | 0 |
| 1 | 1 | 0 | and (d) converting the output logic signal to a voltage indicative of the phase difference between the reference signal and the input signal.

22. The method of claim 21 wherein said two matched comparators have two pairs of transistors, and further comprising the step of providing the output logic signal from collectors of two of the transistors, one from each of the two pairs.

23. The method of claim 21 wherein the step of varying the amplitude comprises the step of selectively providing the reference signal to one of plural operational amplifiers with different amplifications and similar propagation delays in order to selectively vary the amplitude of the reference signal.

24. The method of claim 23 further comprising the step of providing the input signal to a buffer which has a propagation delay which is about the same as the propagation delay encountered by the reference signal in the selected operational amplifier.

25. The method of claim 21 further comprising the step of damping output logic signal voltage variation with a clamping circuit connected to an output of the two comparators.

* * * * *